(12) United States Patent
Matsuda et al.

(10) Patent No.: US 8,099,697 B2
(45) Date of Patent: *Jan. 17, 2012

(54) HARDWARE LOGIC VERIFICATION SUPPORT APPARATUS, VERIFICATION SUPPORT METHOD AND COMPUTER PRODUCT

(75) Inventors: Akio Matsuda, Kawasaki (JP); Ryosuke Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 282 days.

This patent is subject to a terminal disclaimer.

(21) Appl. No.: 12/484,762

(22) Filed: Jun. 15, 2009

(65) Prior Publication Data

US 2010/0064266 A1  Mar. 11, 2010

(30) Foreign Application Priority Data

Sep. 8, 2008  (JP) ................................. 2008-229674

(51) Int. Cl.
*G06F 9/455* (2006.01)
*G06F 17/50* (2006.01)

(52) U.S. Cl. ........ 716/106; 716/107; 716/110; 716/111; 716/112; 716/136; 717/124; 717/127; 717/131; 717/132

(58) Field of Classification Search .................. 716/106, 716/107, 110, 111, 112, 136; 717/124–135
See application file for complete search history.

(56) References Cited

U.S. PATENT DOCUMENTS

| 6,816,825 | B1 * | 11/2004 | Ashar et al. ..................... 703/14 |
| 7,158,993 | B1 * | 1/2007 | Schwabe ....................... 717/116 |
| 7,934,183 | B2 * | 4/2011 | Maturana et al. ............. 716/103 |
| 7,945,898 | B1 * | 5/2011 | Episkopos et al. ............ 717/124 |
| 2006/0155521 | A1 * | 7/2006 | Iwashita .......................... 703/14 |
| 2006/0190861 | A1 | 8/2006 | Matsuura |
| 2006/0195822 | A1 * | 8/2006 | Beardslee et al. ............ 717/124 |
| 2008/0022262 | A1 * | 1/2008 | Prakash et al. ................ 717/124 |
| 2008/0040699 | A1 * | 2/2008 | Okada ............................. 716/18 |
| 2008/0082968 | A1 * | 4/2008 | Chang et al. .................. 717/128 |
| 2008/0104556 | A1 * | 5/2008 | Yamada ............................ 716/5 |
| 2008/0288902 | A1 * | 11/2008 | Nishide et al. ..................... 716/5 |
| 2008/0312890 | A1 * | 12/2008 | Zhu et al. .......................... 703/6 |

FOREIGN PATENT DOCUMENTS

| JP | A 2006-190209 | 7/2006 |
| JP | A 2006-201980 | 8/2006 |

OTHER PUBLICATIONS

Harry D. Foster, et el., "Programming code metrics," Assertion-Based Design, $2^{nd}$ Edition, pp. 129-130; 2004.

* cited by examiner

*Primary Examiner* — Jack Chiang
*Assistant Examiner* — Nha Nguyen
(74) *Attorney, Agent, or Firm* — Greer, Burns & Crain, Ltd.

(57) ABSTRACT

A computer-readable recording medium stores therein a verification support program that causes a computer to execute receiving a hardware description of a combinational circuit to be verified; extracting, from the hardware description, a conditional branch description expressing conditional branch processing; identifying, from among conditional branch descriptions extracted at the extracting of a conditional branch description and based on a description sequence in the hardware description, a combination of conditional branch descriptions having a hierarchical relation; extracting, from among combinations of conditional branch descriptions identified at the identifying, a combination having a potential to satisfy a specified condition; creating a simulation program that causes the specified condition for the conditional branch descriptions included in the combination extracted at the extracting of the combination to be satisfied; and outputting, as assertion information of the combinational circuit, the simulation program created for each combination at the creating.

7 Claims, 16 Drawing Sheets

| | | COVER STATEMENT | |
|---|---|---|---|
| | | APPLICABLE | INAPPLICABLE |
| COMPARISON BETWEEN EXPECTED VALUE AND SIMULATION OUTPUT | AGREE | OPERATION AS INDICATED BY EXPECTED VALUE, INCLUSIVE OF PART AT WHICH MULTIPLE CONDITIONS ARE EFFECTIVE AT THE SAME TIME | OPERATION AS INDICATED BY EXPECTED VALUE BUT PART AT WHICH MULTIPLE CONDITIONS ARE EFFECTIVE AT THE SAME TIME IS NOT VERIFIED<br>· VERIFICATION SCENARIO INSUFFICIENT |
| | NOT AGREE | BUG CAUSING OPERATION THAT IS NOT AS INDICATED BY EXPECTED VALUE | |

| INPUT X | INTERNAL VALUE | | OUTPUT Y |
|---|---|---|---|
| | A | B | |
| 2,5,·· | 1 | 0 | a |
| 1,4,·· | 0 | 1 | b |
| 0,3,·· | 0 | 0 | c |

1500

| INPUT X | INTERNAL VALUE | | OUTPUT Y |
|---|---|---|---|
| | A | B | |
| 3,7,·· | 1 | 1 | a |
| 2,6,·· | 1 | 0 | a |
| 1,5,·· | 0 | 1 | b |
| 0,4,·· | 0 | 0 | c |

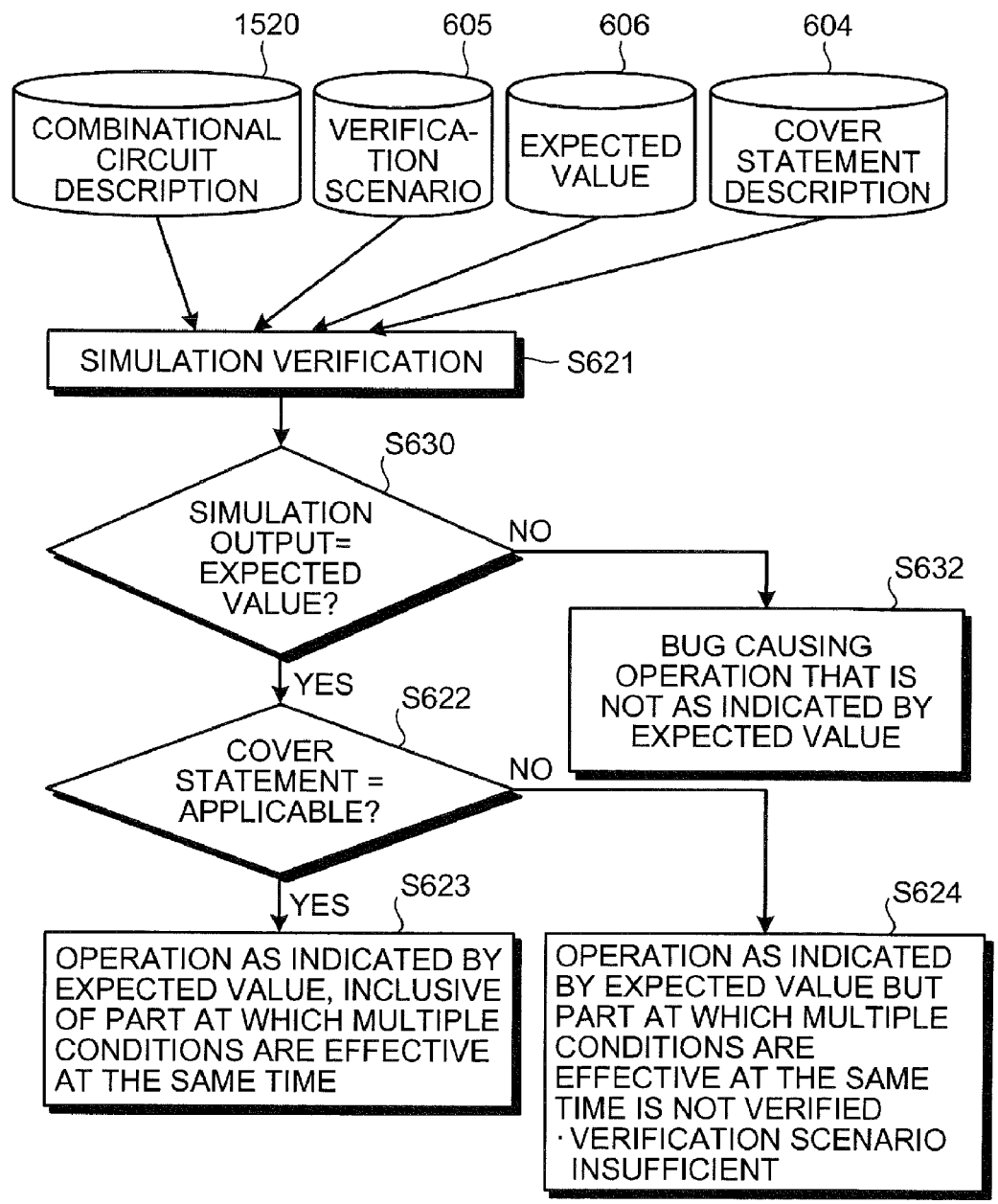

FIG.18

| INPUT | | | OUTPUT | | | DETERMINATION | | GENERAL DETERMINATION |
|---|---|---|---|---|---|---|---|---|
| VERIFICATION SCENARIO | EXPECTED VALUE | CONDITION 1 | CONDITION 2 | SIMULATION OUTPUT | EXPECTED VALUE AND SIMULATION OUTPUT | APPLICABILITY OF COVER STATEMENT | | |
| X = 2 | Y = a | YES | NO | Y = a | AGREE | (INAPPLICABLE) | | OPERATION AS INDICATED BY EXPECTED VALUE BUT PART AT WHICH MULTIPLE CONDITIONS ARE EFFECTIVE AT THE SAME TIME IS NOT VERIFIED · VERIFICATION SCENARIO INSUFFICIENT |
| X = 1 | Y = b | NO | YES | Y = b | AGREE | (INAPPLICABLE) | INAPPLICABLE | |
| X = 0 | Y = c | NO | NO | Y = c | AGREE | (INAPPLICABLE) | | |

1800

HARDWARE LOGIC VERIFICATION SUPPORT APPARATUS, VERIFICATION SUPPORT METHOD AND COMPUTER PRODUCT

CROSS REFERENCE TO RELATED APPLICATIONS

This application is based upon and claims the benefit of priority of the prior Japanese Patent Application No. 2008-229674, filed on Sep. 8, 2008, the entire contents of which are incorporated herein by reference.

FIELD

The embodiment discussed herein is related to circuit verification support.

BACKGROUND

Conventionally, when hardware (circuit) that implements a desired function is designed, logic verification to check for omissions in the design is a fundamental process before moving to manufacture of actual hardware. Specifically, a verification scenario that suits the contents of the hardware design is created, and logic verification is performed using an output result obtained when the verification scenario is input.

Furthermore, verification coverage is obtained to objectively evaluate the verification that has been performed using the verification scenario created as described above. Verification coverage is information concerning an index that indicates the sufficiency of simulation patterns for a subject of verification. Specifically, if the population is all simulation patterns requiring verification, coverage obtained from a rate of the executed simulation patterns is provided as the verification coverage. In this case, verification accuracy is determined to be high if the verification coverage is high.

A problem with this technique concerns the method of extracting "all simulation patterns requiring verification", i.e., the population. Simulation patterns corresponding to the population are referred to as coverage standards. If patterns are extracted that are not effective practically for verification as coverage standards, the patterns do not necessarily contribute to improvement of actual verification efficiency even if the coverage of the simulation is high.

Therefore, methods called path coverage and code coverage in which patterns are comprehensively extracted according to specific standards are used nowadays. In path coverage, patterns to verify all paths causing state transitions in the register of a circuit under verification are extracted. Therefore, with the path coverage method, these patterns are the coverage standards. Code coverage is also called line coverage, and patterns are extracted to verify paths related to input and output of the register in which source codes corresponding to a circuit under verification are described. Further, in the code coverage, these patterns are the coverage standards. Such techniques are disclosed in, for example, Japanese Laid-Open Patent Publication Nos. 2006-190209 and 2006-201980, and "Assertion-Based Design" (2nd Edition) by Foster, Harry D., et al., "Programming Code metrics", pp. 129-130, 2004.

However, even if a verification scenario comprehensive of the coverage standards as described above is created and verification is performed using the verification scenario, a bug due to an omission of verification may occur with respect to branch conditions in the circuit, even if the coverage standards described above are 100% in the verification scenario; a consequence originating in a verification oversight with respect to branch conditions in the circuit.

FIG. 20 is a schematic diagram for explaining an example of oversight concerning a conditional branch error. For example, when hardware (circuit) according to a specification in which priority is set as condition A>condition B is designed, as depicted in FIG. 20, correct description 2010 conforming to the specification may be changed to incorrect description 2020, such as when a designer makes an error when attempting to make a correction. In the correct description 2010, in an if statement 2011 to perform determination of the condition A, an if statement 2012 to perform determination of the condition B is further described.

On the other hand, in the incorrect description 2020, in an if statement 2021 to perform determination of the condition B, an if statement 2022 to perform determination of the condition A is described. Accordingly, in the incorrect description 2020, condition B>condition A, which is different from the intended implementation specified in the specification.

However, with the coverage standards described above, it is possible that a description error, such as the incorrect description 2020, is not verified. FIG. 21 is a comparison chart of correct description and incorrect description. With reference to FIG. 21, an example is explained where the correct description 2010 and the incorrect description 2020 are executed.

As depicted in a chart 2100 in FIG. 21, when the correct description 2010 and the incorrect description 2020 are compared, it is found that four patterns 2101 are executed in response to Yes/No determination results for each condition. Among the four patterns 2101, in three patterns 2102 in which the condition A and the condition B are not satisfied (Yes) at the same time, the processing to be performed is equivalent in both the correct description 2010 and the incorrect description 2020. On the other hand, only in a pattern 2103 in which the condition A and the condition B are satisfied at the same time, the processing to be performed differs.

FIG. 22 is a schematic diagram for explaining a verification scenario having 100% line coverage. Assuming the correct description 2010 is the description of a subject of verification, for a pattern in which neither the condition A nor the condition B are satisfied (No, No) in a verification scenario 2200, verification is performed for processing c of description at the deepest position (lowest level) in the correct description 2010.

Moreover, for a pattern in which only the condition B is satisfied (No, Yes), verification is performed for processing b in the correct description 2010. For a pattern in which only the condition A is satisfied (Yes, No), verification is performed for processing a of description at a shallowest position in the correct description 2010.

Therefore, as depicted in FIG. 22, all descriptions are covered by the verification scenario. As described, in the case of line coverage, even if verification for a pattern in which both the condition A and the condition B are satisfied (Yes, Yes) is not performed, the coverage becomes 100%.

Furthermore, when the path coverage described above is used as the coverage standards, because such a path having the pattern in which both the condition A and the condition B are satisfied (Yes, Yes) is not present in the correct description 2010, it is naturally be excluded from the population of the coverage standards. Therefore, similarly to the line coverage, even if verification for the pattern in which both the condition A and the condition B are satisfied (Yes, Yes) is not performed, the coverage becomes 100%.

As described, with the conventional coverage standards, coverage concerning the conditional branch in a circuit to be verified may not be completely covered even if a verification scenario that achieves 100% coverage is created.

However, a technique to confirm the coverage of conditional branches by a created verification scenario has not been provided. Therefore, if incorrect description, e.g., the incorrect description 2020 explained in FIG. 20, is included, the incorrect description cannot be extracted as a problem, and there has been a problem that hardware design inclusive of a bug is provided.

SUMMARY

According to an aspect of an embodiment, a computer-readable recording medium stores therein a verification support program that causes a computer to execute receiving a hardware description of a combinational circuit to be verified; extracting, from the hardware description, a conditional branch description expressing conditional branch processing; identifying, from among conditional branch descriptions extracted at the extracting of a conditional branch description and based on a description sequence in the hardware description, a combination of conditional branch descriptions having a hierarchical relation; extracting, from among combinations of conditional branch descriptions identified at the identifying, a combination having a potential to satisfy a specified condition; creating a simulation program that causes the specified condition for the conditional branch descriptions included in the combination extracted at the extracting of the combination to be satisfied; and outputting, as assertion information of the combinational circuit, the simulation program created for each combination at the creating.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a chart of the simulation verification using a cover statement;

FIG. 13A is a chart depicting an example of a specification of a circuit to be verified;

FIG. 17 is a diagram depicting an example of a simulation verification using a cover statement;

FIG. 18 is a chart of an output example of a simulation result;

DESCRIPTION OF EMBODIMENTS

Preferred embodiments of the present invention will be explained with reference to the accompanying drawings. In a present embodiment, a simulation program (assertion information) is created to execute processing that satisfies conditions specified by an inspector for conditional branches included in a combinational circuit to be verified. Execution of the simulation program enables determination of whether processing that satisfies the condition specified by a verification scenario is performed and further enables prevention of a bug caused by an omission at verification.

Figure 1:
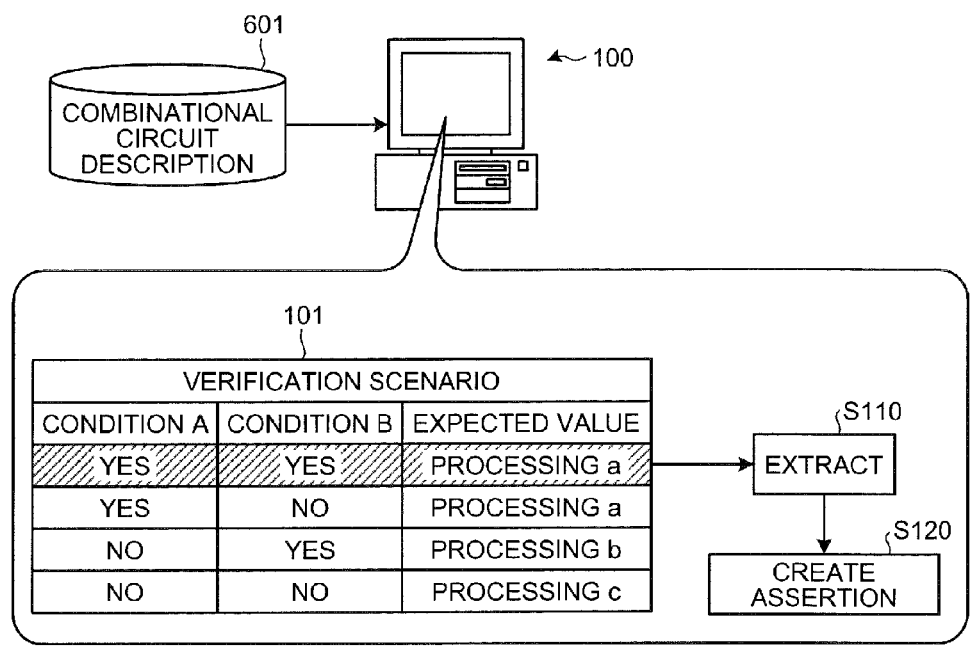
FIG. 1 is a schematic diagram outlining verification support processing according to an embodiment.

FIG. 1 is a schematic diagram outlining verification support processing according to the present embodiment. Upon receipt of combinational circuit description 601 to be verified, a verification support apparatus 100 extracts a combination of conditional branches included in the combinational circuit description 601 (step S110). Thereafter, the verification support apparatus 100 creates assertion information to determine whether all processing patterns concerning respective combinations are verified by a verification scenario 101 (step S120).

Figure 2:
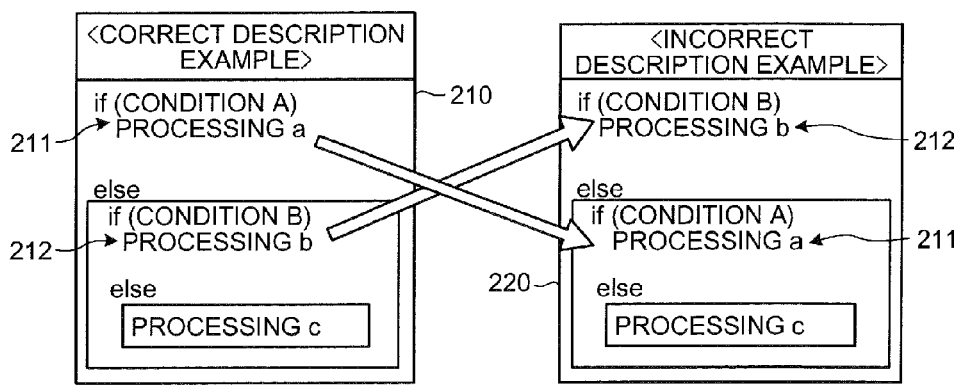
FIG. 2 is a schematic diagram for explaining an example of an error in judgment concerning conditions with respect to hardware design.

FIG. 2 is a schematic diagram for explaining an example of an error in judgment concerning conditions with respect to hardware design. Normally, a designer designs hardware based on specifications. Therefore, a correct description 210 is created first. Later, the designer sometimes changes description contents to change the hardware design to improve efficiency.

Specifically, the sequence or the hierarchy of processes indicated by the description may be altered to minimize the number of clocks or to adjust delays. For example, in the correct description 210, if processing a211 is addition processing for which the processing load is light and processing b212 is multiplication processing for which the processing load is heavy, the designer may attempt to shorten the critical path in the entire description by determining first the processing b212 for which the processing load is heavy. The processing load herein indicates the number of clocks required to complete processing. As described, in the processing of a heavy load, the greater the number of clocks required, more time is required to complete the determination processing.

Therefore, in the example depicted in FIG. 2, the designer may attempt to minimize the total number of clocks by executing first the determination of the processing b212 for which the processing load is heavy. In the correct description 210, because the processing load for the processing a211 is light, if the determination of the condition B included in the processing b212 for which the processing load is heavy is performed first and the determination of the condition A is performed next, the entire processing can be completed with less clocks without affecting the critical path. Depending on the description contents, a predetermined function may be achieved as indicated in the specifications even if the sequence of processing therein is switched. However, if in the correct description 210, the condition A and the condition B are switched, the description becomes the incorrect description 220 and the function indicated in the specifications is not achieved.

As in the incorrect description 220, when the description sequence of the condition A and the condition B is switched to determine first the processing b212 whose processing load is heavy, it can be misunderstood that such a branch where "condition A=condition B=Yes" (both the conditions A and B are satisfied) cannot occur. This is because no such branch where "condition A=condition B=Yes" occurs in the correct description 210.

However, when the description is changed to the incorrect description 220, if the pattern in which the condition A and the condition B are both satisfied at the same time is not verified, verification for an error in condition determination is omitted. Therefore, in the present embodiment, the inspector arranges to extract a combination of conditional branches in which the condition A and the condition B are both satisfied at the same time at step S110 explained in FIG. 1.

Assertion information in which the condition A and the condition B extracted at step S110 are both satisfied at the same time, i.e., a simulation program in which the condition A and the condition B are satisfied at the same time, is created. Creation of the simulation program herein is achieved by creating a cover statement being condition A=Yes and condition B=Yes, for example. Other than the cover statement, provided the description achieves such a simulation in which the condition A and the condition B are satisfied at the same time, a program language to be used is not particularly limited. Therefore, the program language can be selected appropriately with respect to the hardware description or the design environment. By executing the cover statement thus created, the conditional branch specified by the inspector is achieved in the hardware to be verified.

Therefore, based on whether the specified conditional branch is satisfied as a result of executing this assertion information, it is possible to determine whether verification for the conditional branch (conditional branch in which the condition A and the condition B are satisfied at the same time in this example) specified by the inspector has been performed. If the verification for the conditional branch specified by the inspector has not been performed, by performing the verification for the conditional branch for which the verification has been omitted, the verification coverage of truly 100% coverage can be achieved.

Figure 3:
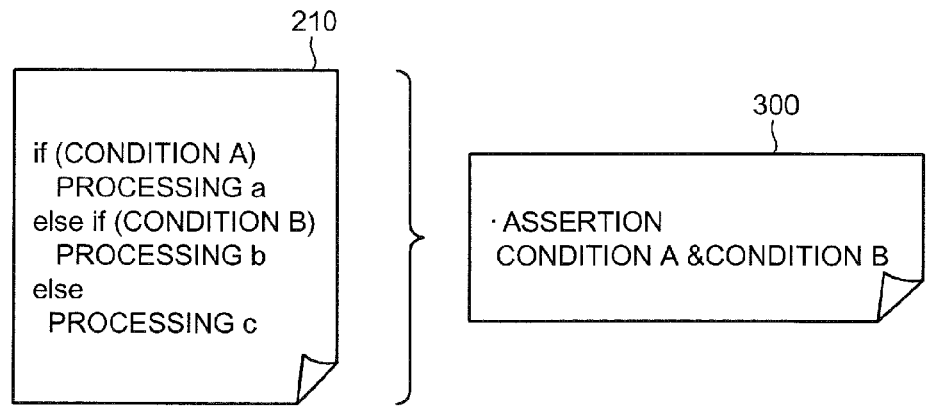
FIG. 3 is a schematic diagram for explaining a subject of assertion information creation.

The verification support apparatus 100 by which the verification support processing according to the present embodiment described with reference to FIG. 1 is implemented and the processing thereby are explained below. FIG. 3 is a schematic diagram for explaining a subject of the assertion information creation. In the verification support processing explained below, assertion information 300 targeted at an if statement (if . . . else if) by which an output result changes by switching condition branches (the condition A and the condition B) in a correct description 210 is created. Naturally, for different description contents, the inspector can specify a different conditional branch for which the assertion information 300 is created.

In the present embodiment, in any kind of hardware description, a case including more than one conditional branch is to be targeted for the creation of the assertion information. If the designer specifies the priority for conditional branches independently, the priority is applied. For example, the specification of priority may be an if statement that includes the keyword "priority". In addition to the specification of the priority, a part for which instruction is written indicating that plural conditional branches in the hardware description definitely cannot be satisfied at the same time is also excluded from the target.

Figure 4:
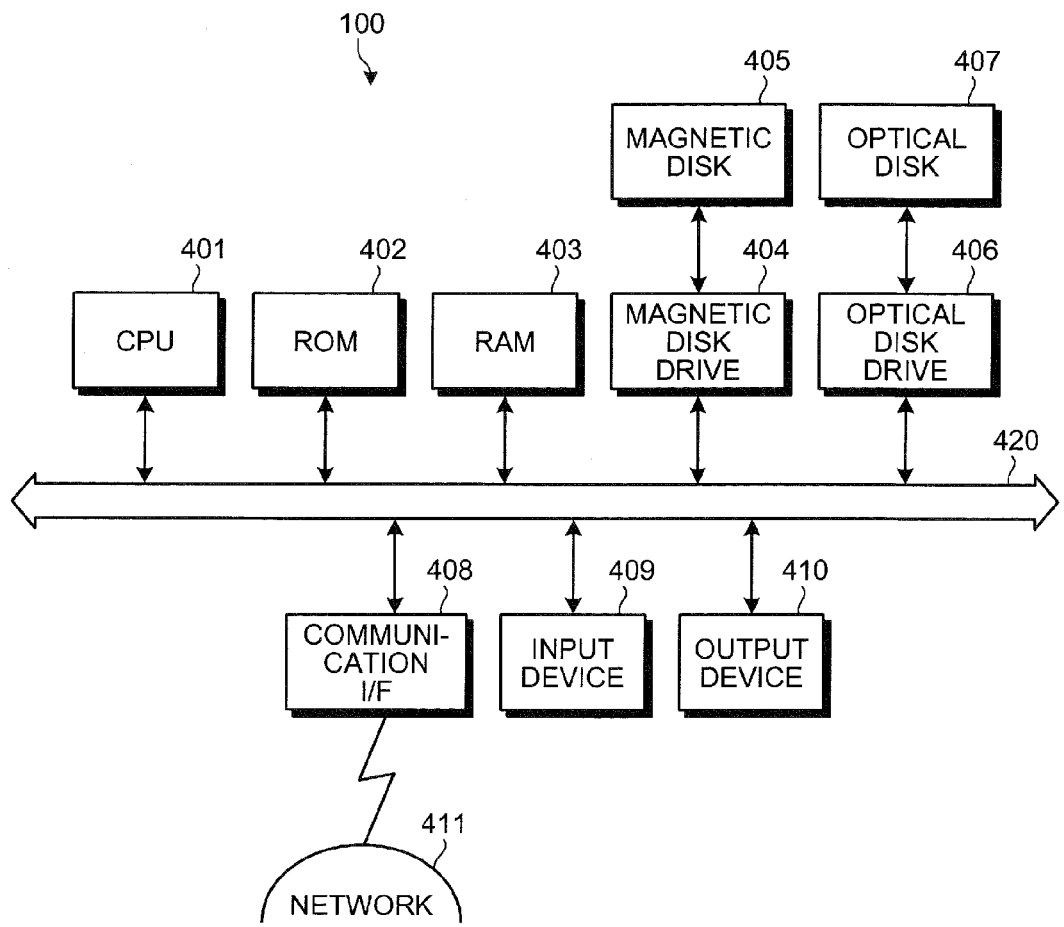
FIG. 4 is a block diagram of a verification support apparatus according to the embodiment.

FIG. 4 is a block diagram of a verification support apparatus according to the embodiment. As depicted in FIG. 4, a verification support apparatus 100 includes a central processing unit (CPU) 401, a read-only memory (ROM) 402, a random access memory (RAM) 403, a magnetic disk drive 404, a magnetic disk 405, a optical disk drive 406, an optical disk 407, a communication interface (I/F) 408, an input device 409, and an output device 410, connected to one another by way of a bus 420.

The CPU 401 governs overall control of the verification support apparatus 100. The ROM 402 stores therein various programs such as a boot program and a verification support program. The RAM 403 is used as a work area of the CPU 401. The magnetic disk drive 404, under the control of the CPU 401, controls the reading and writing of data with respect to the magnetic disk 405. The magnetic disk 405 stores therein the data written under control of the magnetic disk drive 404. The ROM 402 may further store therein the assertion information created by the verification support program and a verification program that executes verification simulation using the assertion information and verification scenario. In such a case, verification does not end with the assertion information created by the verification support apparatus 100, the inspector can be provided the actual results of the verification.

The optical disk drive 406, under the control of the CPU 401, controls the reading and writing of data with respect to the optical disk 407. The optical disk 407 stores therein the data written under control of the optical disk drive 406, the data being read by a computer.

The communication I/F 408 is connected to a network 411 such as a local area network (LAN), a wide area network (WAN), and the Internet through a communication line and is connected to other apparatuses through this network 411. The communication I/F 408 administers an internal interface with the network 411 and controls the input/output of data from/to external apparatuses. For example, a modem or a LAN adaptor may be employed as the communication I/F 408.

The input device 409 receives input from an external source to the verification supporting apparatus 420. The input device 409 can specifically be a keyboard, a mouse, etc.

In the case of the keyboard, the keyboard includes, for example, keys for inputting letters, numerals, and various instructions and performs the input of data. The input device 409 may be a touch-panel-type input pad or numeric keypad, etc. In the case of a mouse, the input device 409, for example, performs the movement of the cursor, selection of a region, or movement and size change of windows. The input device 409 may be a track ball or a joy stick provided each respectively has a function similar to a pointing device.

The output device 410 outputs verification scenarios created by the verification supporting apparatus 400 and verification results obtained using the verification scenarios. Specific examples of the output device 410 include a display, a printer, etc.

In the case of a display, the output device 410 displays, for example, data such as texts, images, functional information, etc., in addition to a cursor, icons, or tool boxes. A cathode ray tube (CRT), a thin-film-transistor (TFT) liquid crystal display, a plasma display, etc., may be employed as the display. In the case of a printer, the output device 410, for example, prints image data and text data. A laser printer or an ink jet printer may be employed as the printer.

Figure 5:
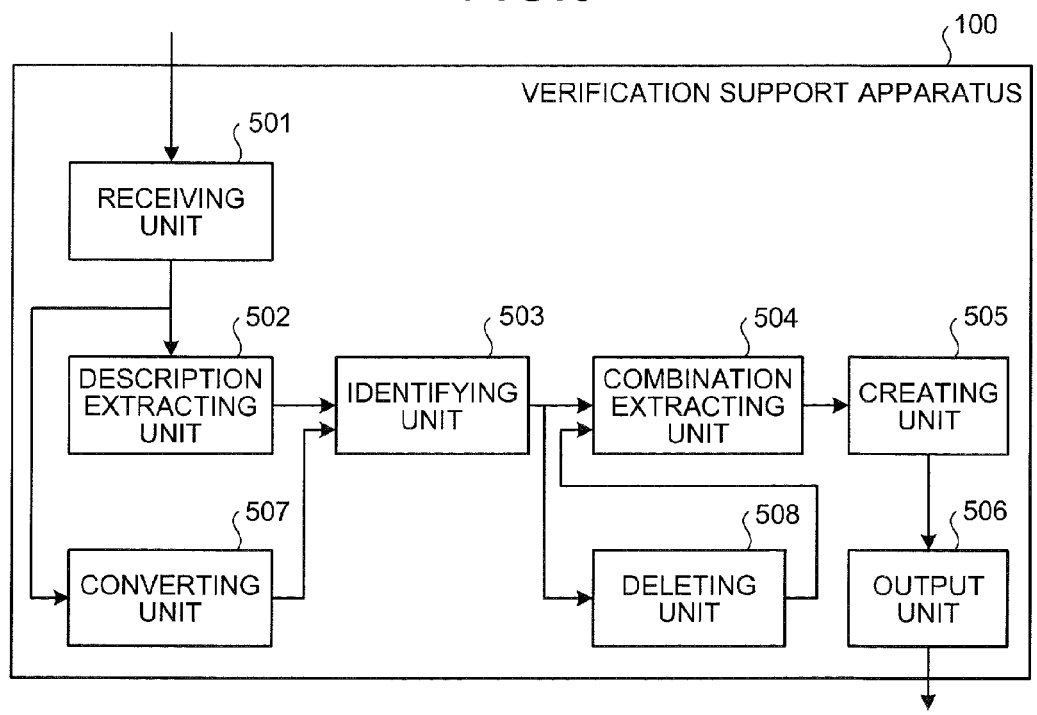
FIG. 5 is a functional diagram of the verification support apparatus.

FIG. 5 is a functional diagram of the verification support apparatus. The verification support apparatus 100 includes a receiving unit 501, a description extracting unit 502, an identifying unit 503, a combination extracting unit 504, a creating unit 505, an output unit 506, a converting unit 507, and a deleting unit 508. These functional units (the receiving unit 501 to the deleting unit 508) to be a control unit are implemented by causing the CPU 401 to execute a verification program stored in a storage area such as the ROM 402, the RAM 403, the magnetic disk 405, and the optical disk 407, or by causing another device that is connected thereto through the communication I/F 408 to execute the verification program.

The receiving unit 501 receives hardware description of a combinational circuit to be verified. Accordingly, in this example, the combinational circuit description 601 described in FIG. 1 is input as the hardware description of the combinational circuit to be verified, and the receiving unit 501 receives the combinational circuit description 601. The received hardware description is stored in a storage area such as the RAM 403, the magnetic disk 405, and the optical disk 407.

The description extracting unit 502 extracts from the hardware description received by the receiving unit 501, conditional branch description expressing conditional branch processing. The extracted conditional branch description is stored in a storage area such as the RAM 403, the magnetic disk 405, and the optical disk 407.

The identifying unit 503, from among the conditional branch descriptions extracted by the description extracting unit 502, identifies a combination of conditional branch descriptions in hierarchy by referring to a description sequence of the hardware description. Conditional branch descriptions in hierarchy are, for example, the combination of the condition A and the condition B described at a lower level in the correct description 210 depicted in FIG. 2. If more than one combination in hierarchy is present among the extracted conditional branches, all such combinations are identified. Furthermore, in addition to a combination of two levels as condition A-condition B, if a combination further including a conditional branch at a higher level or a lower level is present, a combination of three levels or four levels is identified.

Moreover, when the receiving unit 501 receives priority information that indicates execution priority for conditional branches included in the hardware description relative to other conditional branches, the identifying unit 503 may identify a combination of conditional branch descriptions in hierarchy based on the priority information. The priority information is information indicating a hierarchical relation of conditional branches, and for example, when the condition A is described at a higher level than the condition B, "condition A>condition B" is set. When the priority information indicating "condition A>condition B" is received, the identifying unit 503 may output a combination by identifying the hierarchical relation of the condition A and the condition B. Any combination identified by any method is stored in a storage area such as the RAM 403, the magnetic disk 405, and the optical disk 407.

The combination extracting unit 504, from among the combinations of conditional branch descriptions identified by the identifying unit 503, extracts a combination having a potential to satisfy a condition specified. In this example, the condition specified by the inspector requires all conditional branches to be effective, and therefore, a combination having a possibility that all conditions are "Yes" is extracted from among the combinations of conditional branch descriptions identified by the identifying unit 503. The extracted combination is stored in a storage area such as the RAM 403, the magnetic disk 405, and the optical disk 407.

The creating unit 505 creates a simulation program that causes the specified conditions at the conditional branch descriptions extracted by the combination extracting unit 504 to be satisfied. Because the condition that all conditional branches are effective is specified as described above, a simulation program by which the extracted combinations are all "Yes" is created. The simulation program created herein may be of any computer program provided the condition above is satisfied. The created simulation program is stored in a storage area such as the RAM 403, the magnetic disk 405, and the optical disk 407.

The output unit 506 outputs the simulation program created for each combination by the creating unit 505, as the assertion information 104 of the combinational circuit to be verified. In other words, with each extracted combination, a simulation program in which conditions in the combination are satisfied at the same time is associated. The form of output includes display on a display device, print out by a printer, and transmission to an external device through the communication I/F 408. Further, output may be to a storage area such as the RAM 403, the magnetic disk 405, and the optical disk 407.

The functional units 501 to 506 explained above are the minimum components required to achieve the verification support processing according to the present embodiment. In the verification support apparatus 100, the converting unit 507 and the deleting unit 508 are provided as a function to speed up the assertion creation processing described above.

The converting unit 507 converts the hardware description received by the receiving unit 501 into a CFG that expresses the flow of control of the combinational circuit to be verified. The CFG obtained by the conversion performed by the converting unit 507 is stored in a storage area such as the RAM 403, the magnetic disk 405, and the optical disk 407. When the hardware description is converted into a CFG by the converting unit 507, the identifying unit 503 can identify, in the CFG, conditional branch descriptions that are connected in parallel as a combination of conditional branch descriptions having a hierarchical relation. By such conversion of hardware description into a CFG via the converting unit 507, combinations of conditional branch descriptions in hierarchy can be easily identified.

The deleting unit 508 deletes a combination of conditional branch descriptions from among the combinations of conditional branch descriptions identified by the identifying unit 503, the combination being designated in advance. Therefore, the combinations of conditional branch descriptions after deletion are output from the deleting unit 508 and are stored in a storage area such as the RAM 403, the magnetic disk 405, and the optical disk 407. When the deleting unit 508 is used, the combinations remaining after the deletion of by the deleting unit 508 are input to the combination extracting unit 504 and the combination extracting unit 504 extracts a combination having the potential of satisfying the specified condition. As described, by providing the deleting unit 508, the number of combinations subject to extraction by the combination extracting unit 504 can be reduced. Accordingly, the processing load on the combination extracting unit 504 can be reduced.

The verification support apparatus 100 creates the assertion information to confirm whether verification of a conditional branch that has a possibility of being omitted from verification in the conventional technique has been performed by the functional units explained above. Verification of a combinational circuit can be performed by the conventional verification apparatus using this assertion information, or verification using the assertion information can be performed by further providing a functional unit to perform the verification to the verification support apparatus 100. Therefore, in the following description, a series of the processing when the functional units achieving up to the creation of the assertion information explained in FIG. 5 and a functional unit to perform verification using the created assertion information are provided in the verification support apparatus 100 is explained.

Figure 6:
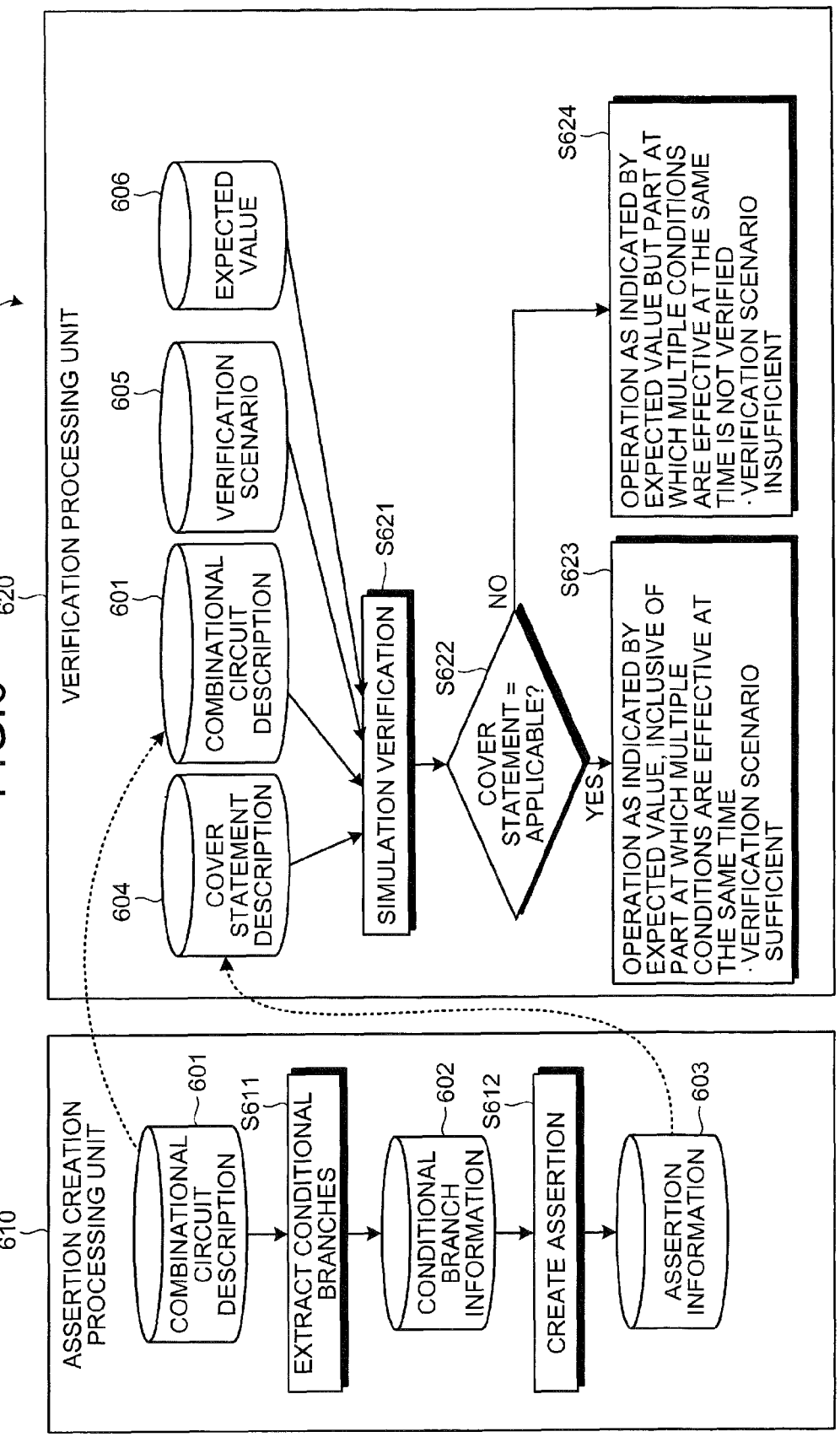
FIG. 6 is a schematic diagram for explaining processing performed by the verification support apparatus.

FIG. 6 is a schematic diagram for explaining processing performed by the verification support apparatus. As depicted in FIG. 6, the verification support apparatus 100 includes an assertion creation processing unit 610 and a verification processing unit 620. The assertion creation processing unit 610 is a functional unit that performs processing to create the assertion information by which the specified condition is satisfied, explained in FIG. 5. The verification processing unit 620 is a functional unit that determines whether verification for the specified condition has been performed, using the assertion information created by the assertion creation processing unit 610. A series of processing performed by each of the functional units 610 and 620 is explained.

First, processing performed by the assertion creation processing unit 610 is explained. The assertion creation processing unit 610 performs roughly two types of processing including processing to extract conditional branches (step S611) and processing to create the assertion information (step S612).

Figure 7:
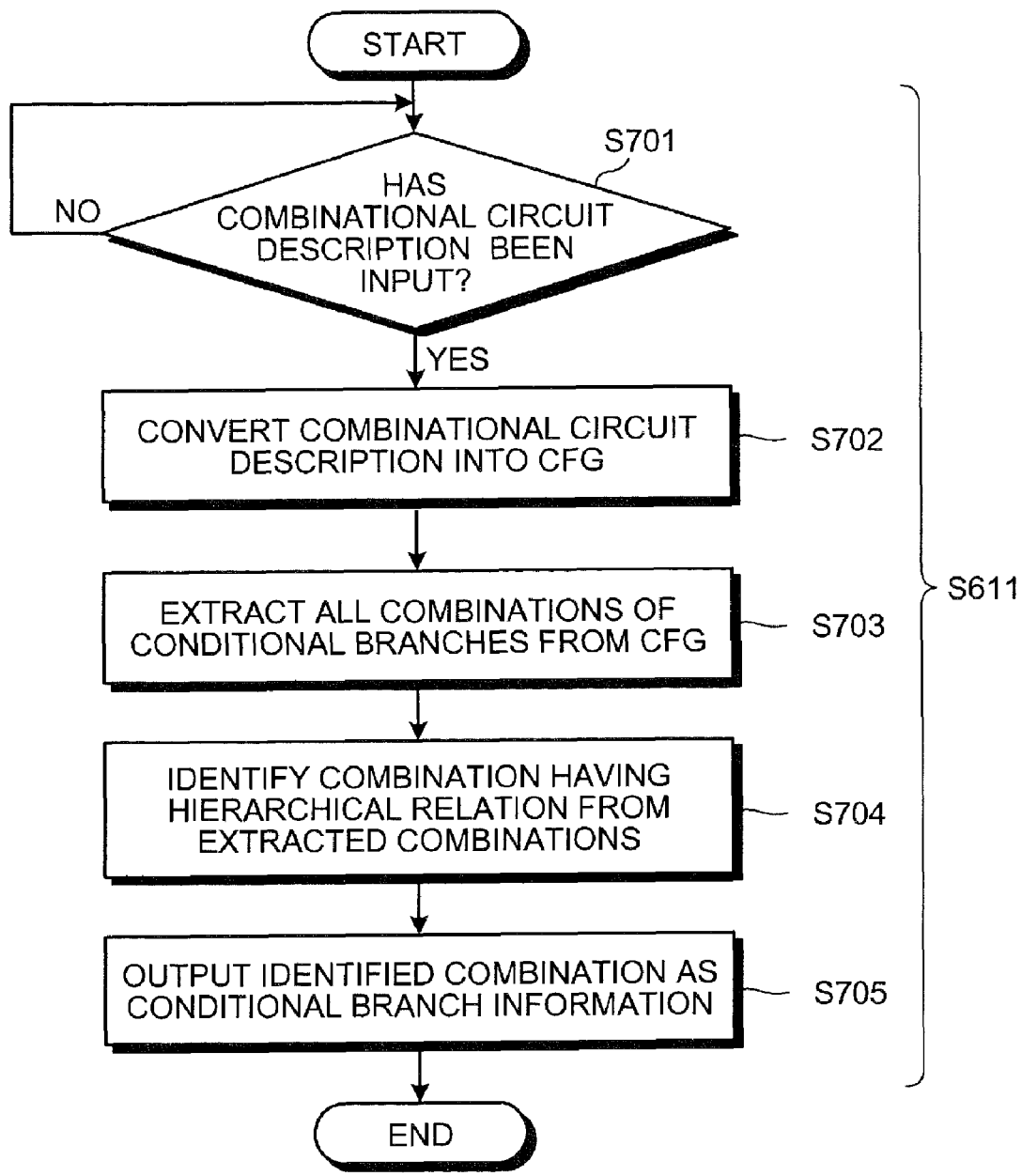
FIG. 7 is a flowchart of conditional branch extraction processing.

First, the processing to extract conditional branches performed by the assertion creation processing unit 610 explained in FIG. 6 is explained. FIG. 7 is a flowchart of the conditional branch extraction processing. As depicted in the flowchart in FIG. 7, first, it is determined whether the combinational circuit description 601 has been input (step S701). Waiting occurs until the combinational circuit description 601 is input (step S701: NO), and when the combinational circuit description 601 is input (step S701: YES), the input combinational circuit description 601 is converted into a CFG (step S702).

Figure 8:
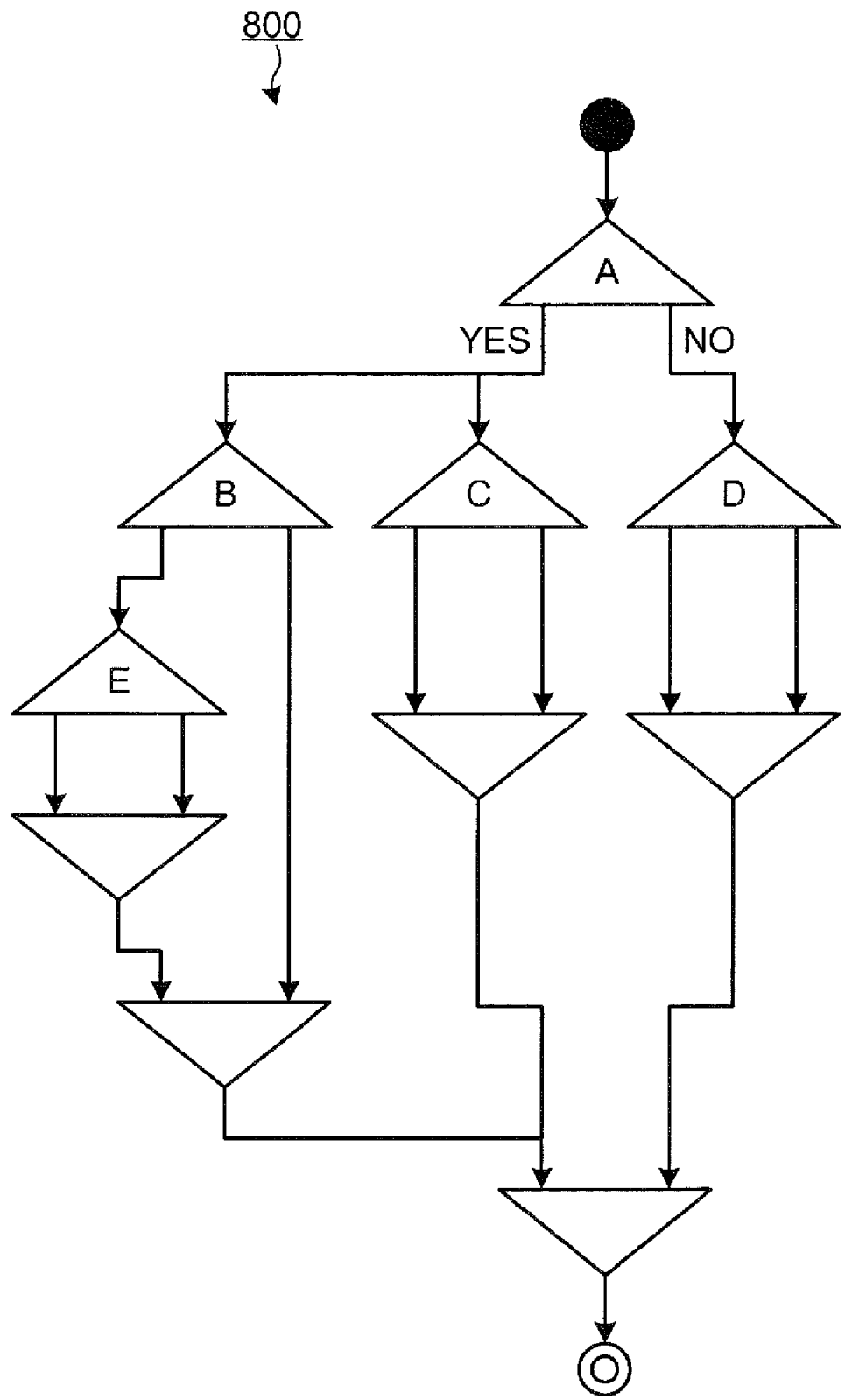
FIG. 8 is a schematic diagram for explaining an example of control flow graph (CFG) conversion.

The conversion into a CFG is explained herein. FIG. 8 is a schematic diagram for explaining an example of CFG conversion. A CFG is a graph expressing a flow of control with respect to the hardware description. Therefore, a CFG 800 expresses a flow of control from the beginning (black circle in FIG. 8) to the end (concentric rings in FIG. 8) with respect to the combinational circuit description 601 input to the verification support apparatus 100. By conversion of the combinational circuit description 601 into a CFG, the hierarchical relation among respective conditional branches is identified, and a combination of conditional branches in hierarchy can be identified easily.

Reference of the explanation returns to FIG. 7. All combinations of conditional branches are extracted from the CFG obtained by conversion at step S702 (step S703). A combination in hierarchy is then identified from among the all combinations extracted at step S703 (step S704). The hierarchical relation is relation of conditional branches connected in series in the CFG. In the case of the CFG 800 depicted in FIGS. 8, A and B, A and B and E, A and C, A and D, and B and E are identified to have hierarchical relations. The respective combinations identified at step S704 are output as conditional branch information 602 (step S705), and a series of the conditional branch extraction processing ends.

Figure 9:
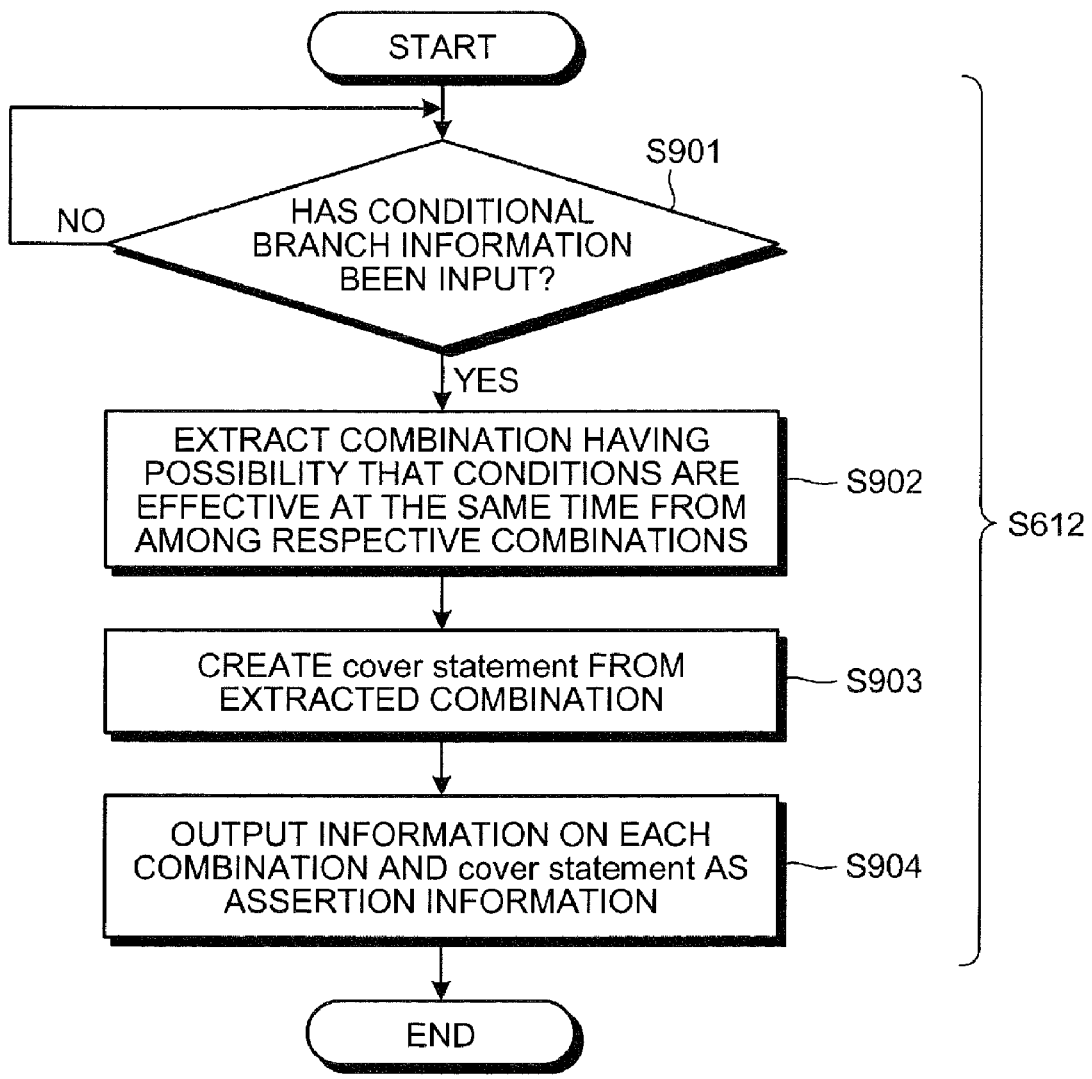
FIG. 9 is a flowchart of the assertion creation processing.

Next, the processing to create the assertion information by the assertion creation processing unit 610 explained in FIG. 6 is explained. FIG. 9 is a flowchart of the assertion creation processing. As depicted in the flowchart, first, it is determined whether the conditional branch information 602 has been input (step S901). At step S901, the determination is made based on whether the conditional branch information 602 extracted by the conditional branch extraction processing explained with reference to FIG. 7 has been input.

Waiting occurs until the conditional branch information 602 is input (step S901: NO), and when the conditional branch information 602 is input (step S901: YES), a combination having a possibility that conditional branches are effective at the same time is extracted from among the combinations included in the input conditional branch information 602 (step S902). A cover statement that satisfies the respective conditions at the same time is then created from the combination extracted at step S902 (step S903), and finally, information on the respective combinations and the cover statement is output as the assertion information 603 (step S904), ending a series of the assertion creation processing.

When the combinational circuit to be verified is description, such as the CFG 800, assertion information is created as follows.

A and B: cover (AandB)
A and C: cover (AandC)
A and B and E: cover (AandBandE)
B and E: cover (BandE)

Furthermore, by adding extended processing to the verification support apparatus 100 described above, the processing load can be reduced. Extended processing of the verification support apparatus 100 may be processing to delete, from among combinations of conditional branches, a combination of conditional branches that definitely cannot be effective at the same time. This processing is performed between the processing to extract the conditional branches described above (step S611) and the processing to create the assertion information (step S612), and is performed upon input of the conditional branch information 602 as a trigger.

Figure 10:
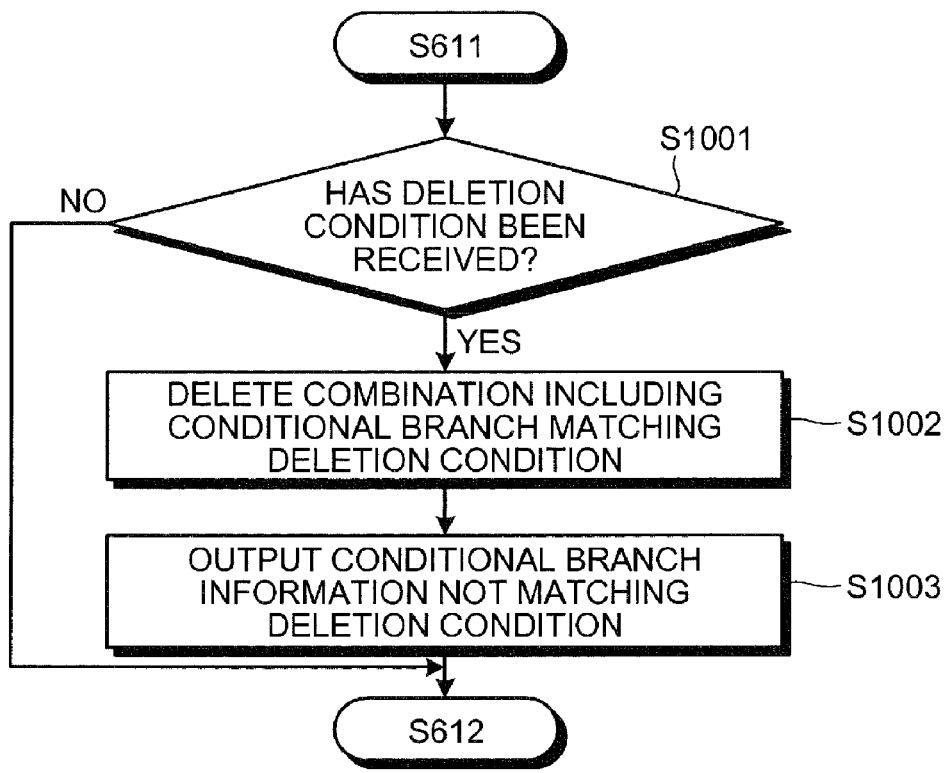
FIG. 10 is a flowchart of extended processing using a deletion condition.

FIG. 10 is a flowchart of extended processing using a deletion condition. As depicted in the flowchart in FIG. 10, first, it is determined whether a deletion condition has been received after the input of the conditional branch information 602 (step S1001). If a deletion condition is received (step S1001: YES), it is determined that the extended processing is to be applied, and a combination including conditional branches matching the deletion condition is deleted from among the combinations of conditional branches included in the input conditional branch information 602 (step S1002).

Figure 11:
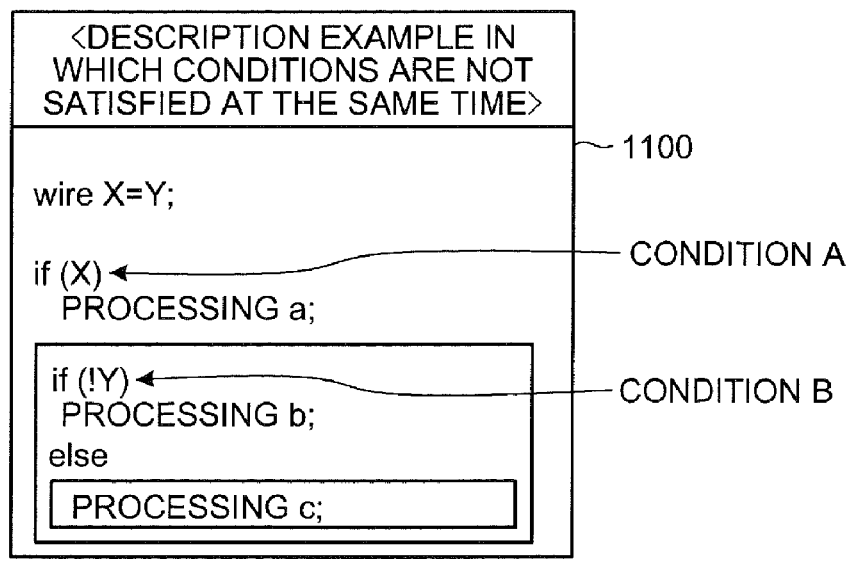
FIG. 11 is a schematic diagram for explaining description of the deletion condition.

FIG. 11 is a schematic diagram for explaining description of the deletion condition. At step S1001, the deletion condition is received from the inspector, and as the deletion condition, a description 1100 in which conditions are not satisfied at the same time or the like is input. Other than this, combinations to be deleted can be independently specified to be deleted.

If a deletion condition is not received at step S1001 (step S1401: NO), it is determined that the extended processing is not to be applied, and the process proceeds to step S612. The combinations of conditional branches remaining after the deletion processing at step S1002 are output as the conditional branch information 602 (step S1003), and the process proceeds to step S612.

As described, by the processing prior to the processing for creating the assertion information, a combination of the conditions that cannot be satisfied at the same time is deleted in advance. Therefore, a combination having a possibility that the conditions are satisfied at the same time can be identified more efficiently.

Next, the verification processing unit 620 that, using the assertion information 603 created by the assertion creation processing unit 610, performs verification of a circuit is explained. As depicted in FIG. 6, in the verification processing unit 620, a cover statement description 604 of the combination of conditional branches wished to be verified is extracted from the assertion information 603 created by the assertion creation processing unit 610. Simulation verification is then performed using the combinational circuit description 601 of the circuit, a verification scenario 605, and an expected value 606 corresponding to the verification scenario 605 (step S621).

It is determined whether the cover statement description 604 is applicable from a result of the verification at step S621 (step S622). When the cover statement description 604 is determined to be applicable (step S622: YES), it is determined that operation as indicated by the expected value has been performed inclusive of a part at which multiple conditional branches are effective at the same time (step S623). Such determination means the state in which all required verification scenarios are included.

On the other hand, when the cover statement description 604 is determined to be inapplicable (step S622: NO), it is determined that although operation as indicated by the expected value is performed, a part at which multiple conditional branches are effective at the same time has not been verified (step S624). This means that the verification scenario is not sufficient. Therefore, step S624 indicates that there is an omission in the verification. Thus, the inspector can perform appropriate processing such as an addition of the verification scenario where multiple conditional branches are effective at the same time.

FIG. 12 is a chart of the simulation verification using a cover statement. A chart 1200 indicates verification states of a circuit to be verified, according to results of the simulation verification described above. When the expected value and an output in the simulation do not coincide, it is determined that operation as indicated by the expected value cannot be performed as a result of a bug present in the combinational circuit description 601. Therefore, the inspector can perform processing to eliminate the bug.

As described, with the verification support apparatus 100 according to the present embodiment, verification omission that has not been resolved even with a verification scenario of 100% coverage in the conventional line coverage or path coverage, can be detected by focusing on a specific condition of conditional branches.

Figure 13B:
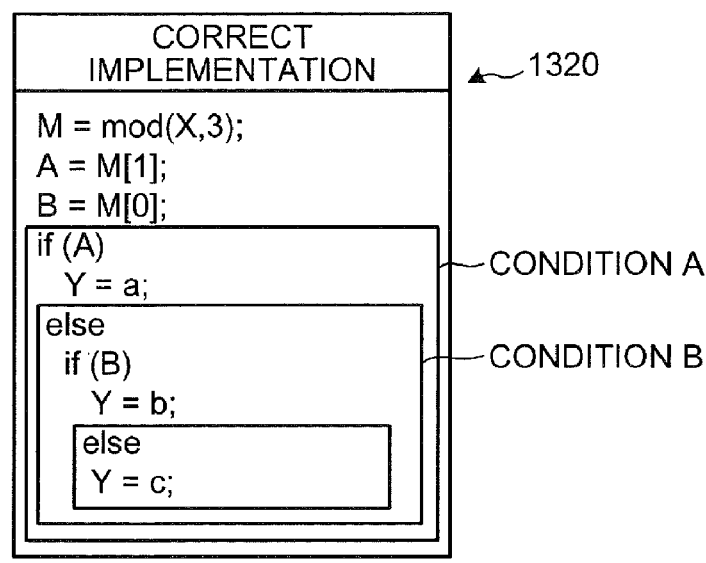
FIG. 13B is a schematic diagram for explaining an example of correct implementation.

Next, an actual example with specific values is explained. FIG. 13A is a chart depicting an example of a specification of a circuit to be verified. FIG. 13B is a schematic diagram for explaining an example of correct implementation. As indicated by the specification depicted in a chart 1300 in FIG. 13A, the circuit performs processing to output any value among a, b, and c depending on a value of a remainder obtained when an input X is divided by 3.

A description 1320 depicted in FIG. 13B is an example of a correct implementation described based on the specification depicted in the chart 1300. According to the specification, the condition B is positioned at a lower level of the condition A. The verification scenario having 100% line coverage in the description 1320 is as follows.
1. Input: X=2 Expected value: [A=1, B=0, Y=a]
2. Input: X=1 Expected value: [A=0, B=1, Y=b]
3. Input: X=0 Expected value: [A=0, B=0, Y=c]

Figure 14:
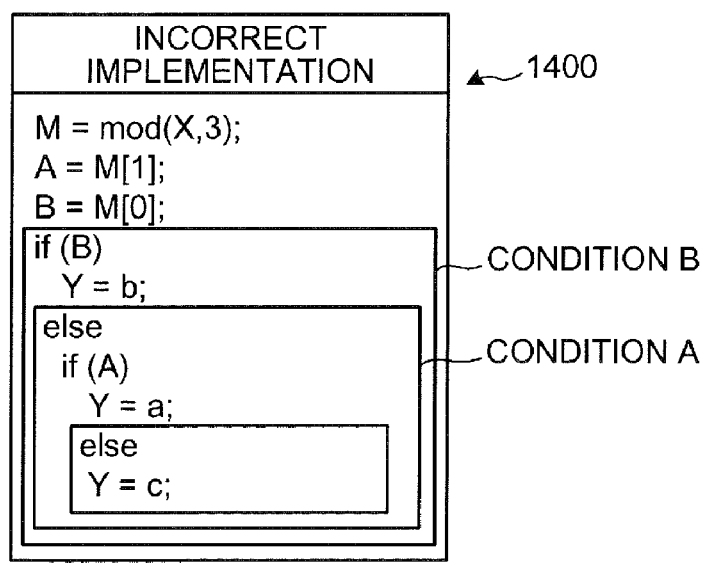
FIG. 14 is a schematic diagram for explaining an example of incorrect implementation.

In an attempt to improve the efficiency of the circuit later, the designer alters a part of the description without realizing an error, and consequently, an incorrect implementation results. FIG. 14 is a schematic diagram for explaining an example of incorrect implementation. As depicted in a description 1400 in FIG. 14, to execute the processing in the condition B first, the hierarchical relation between the condition A and the condition B is changed. However, with the description 1400, a value of an output Y is equal to the expected value. Therefore, the same output as that of the correct implementation of the description 1320 is obtained even with the incorrect implementation.

Figures 15A, 15B:
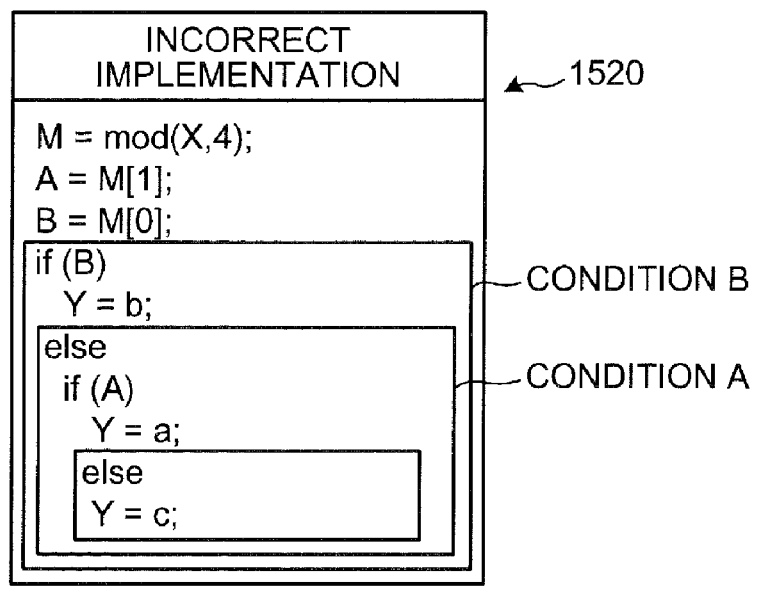
FIG. 15A is a chart depicting an example of alteration of a specification.
FIG. 15B is a schematic diagram for explaining an example of implementation after the specification is changed.

As described, if the specification of the chart 1300 is reflected, because the output does not vary between the description 1320 and the description 1400, there is no problem. However, a problem originating in the error surfaces when the specification is changed. FIG. 15A is a chart depicting an example of alteration of the specification. The designer may alter the specification of the circuit to be verified as depicted in a chart 1500 maintaining the description 1400. As depicted in the chart 1500, in the specification after the change, processing to output any value among a, b, and c depending on a value of a remainder obtained when an input X is divided by 4 is performed. After the change of the specification, the line coverage is 100% with the verification scenario described above. Therefore, the verification scenario is also applied as it is.

FIG. 15B is a schematic diagram for explaining an example of implementation after the specification is changed. Because the incorrect implementation explained in FIG. 14 is used, the hierarchy of the condition A and the condition B is switched in a description 1520. However, after the change of the specification, such a condition that internal values A and B are both satisfied at the same time (A=1 and B=1) appears. As described, because the verification scenario before the change of the specification is applied, a verification scenario in which the internal values A and B are effective at the same time is omitted therein. For example, when the input X=3, the expected values should be [A=1, B=1, Y=a]; however, a corresponding verification scenario is not prepared. Furthermore, when the input X=3 is input to the description 1520, a bug of Y=b (expected value is Y=a) is output without being verified.

Figure 16:
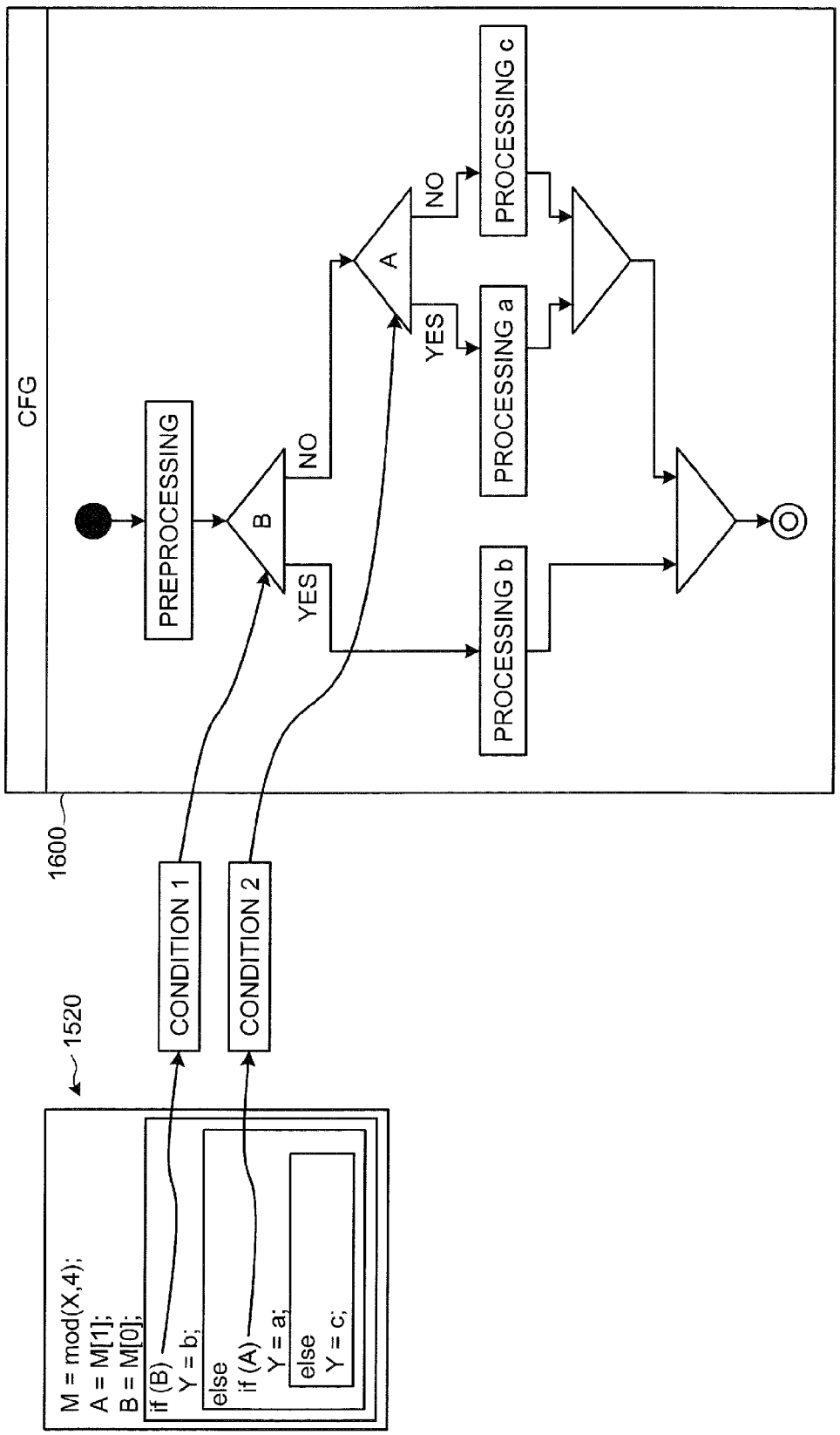
FIG. 16 is a schematic diagram depicting the CGF conversion of a combinational circuit after the specification is changed.

Therefore, it is necessary to create assertion and check whether there is a verification omission. FIG. 16 is a schematic diagram depicting the CGF conversion of a combinational circuit after the specification is changed. As explained with respect to FIG. 7, upon receipt of a combinational circuit description (the description 1520 herein), branch conditions (conditions 1, 2) are extracted and converted into a CFG 1600. After the CFG conversion, a combination of conditional branches in which conditions connected in series have a hierarchical relation is identified from the CFG 1600 as explained with reference to FIG. 8.

In the description 1520, assertion information in which the conditions 1 and 2 are satisfied at the same time is created. In the case of the description 1520, a cover statement (condition 1 and condition 2) by which the conditions 1 and 2 are satisfied at the same time is created. FIG. 17 is a diagram depicting an example of the simulation verification using the cover statement. When the assertion information is created for the description 1520, simulation verification is performed using the description 1520 of the circuit to be verified, the verification scenario 605, the expected value 606, and the cover statement description 604 ([cover (condition 1 and condition 2)] in this example) that is extracted from the assertion information (step S621).

Although the simulation verification at step S621 is the same processing as the simulation verification explained in FIG. 6, determination of whether a simulation output is equal to the expected value (step S630) may be added after the process at step S621. When the simulation output is determined to be equal to the expected value at step S630 (step S630:YES), the process proceeds directly to step S622. When the simulation output is determined to be not equal to the expected value (step S630: NO), it is determined that a bug in the description 1520 is the cause of operation that is not as indicated by the expected value (step S632). Because the processes at step S622 and after are explained with respect to FIG. 6, the explanation therefor is omitted herein.

FIG. 18 is a chart of an output example of a simulation result. Based on an output example corresponding to a result of the simulation verification explained with reference to FIG. 17, determination is respectively made as depicted in a chart 1800. The inspector refers to this determination result to identify an omission in the verification scenario, and adds a verification scenario omitted in the verification scenario thereto, thereby obtaining a verification coverage of truly 100%.

Figure 19:
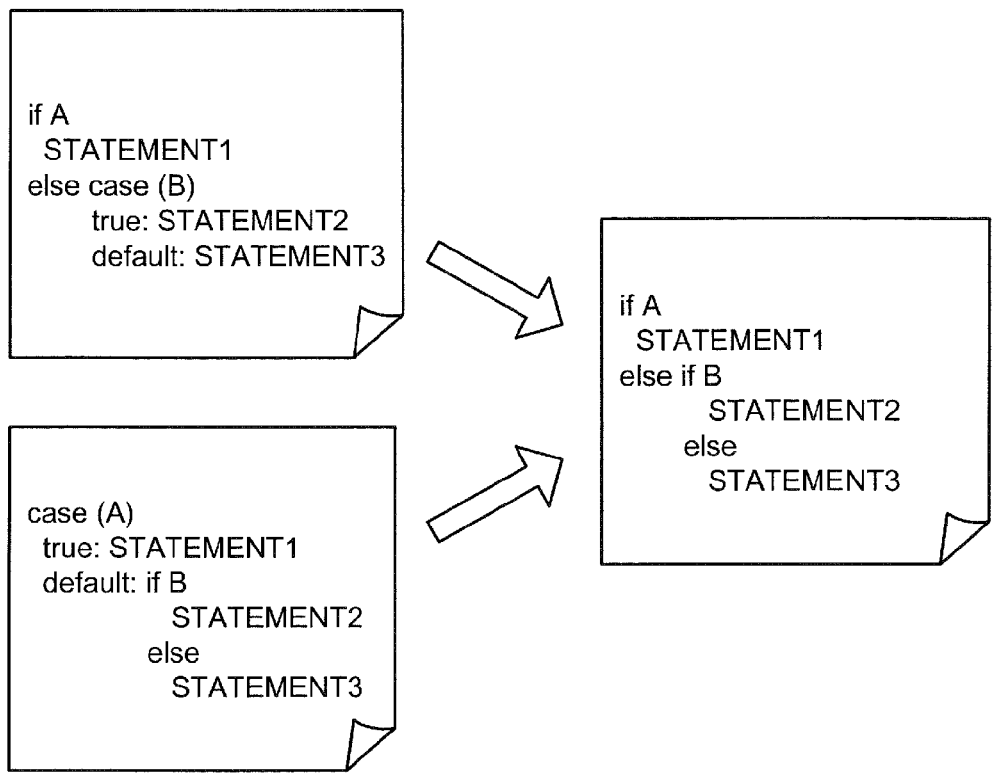
FIG. 19 is a schematic diagram for explaining replacement of a case statement with an if statement.
Figure 20:
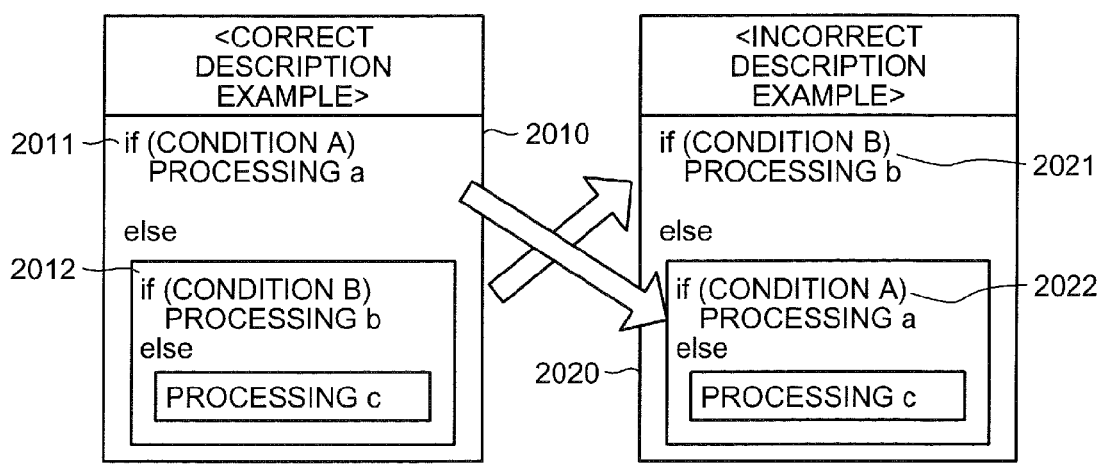
FIG. 20 is a schematic diagram for explaining an example of oversight concerning a conditional branch error.
Figure 21:
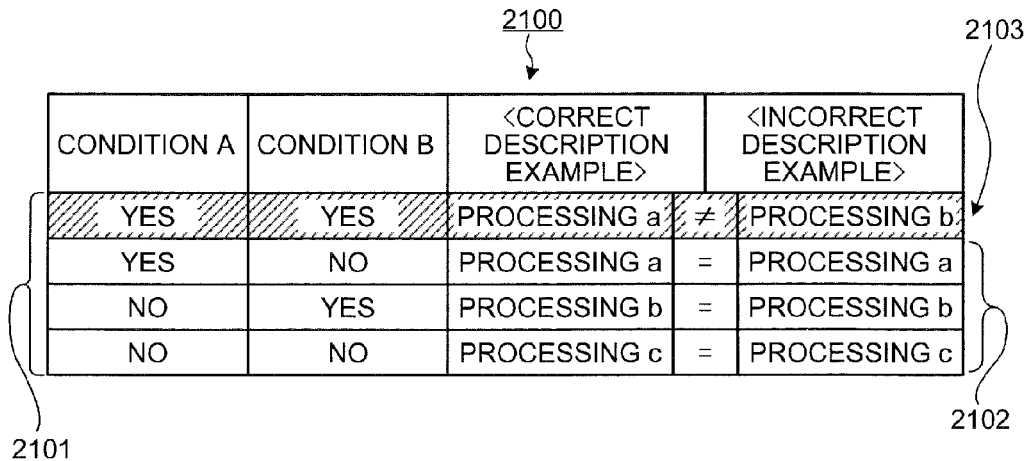
FIG. 21 is a comparison chart of correct description and incorrect description.
Figure 22:
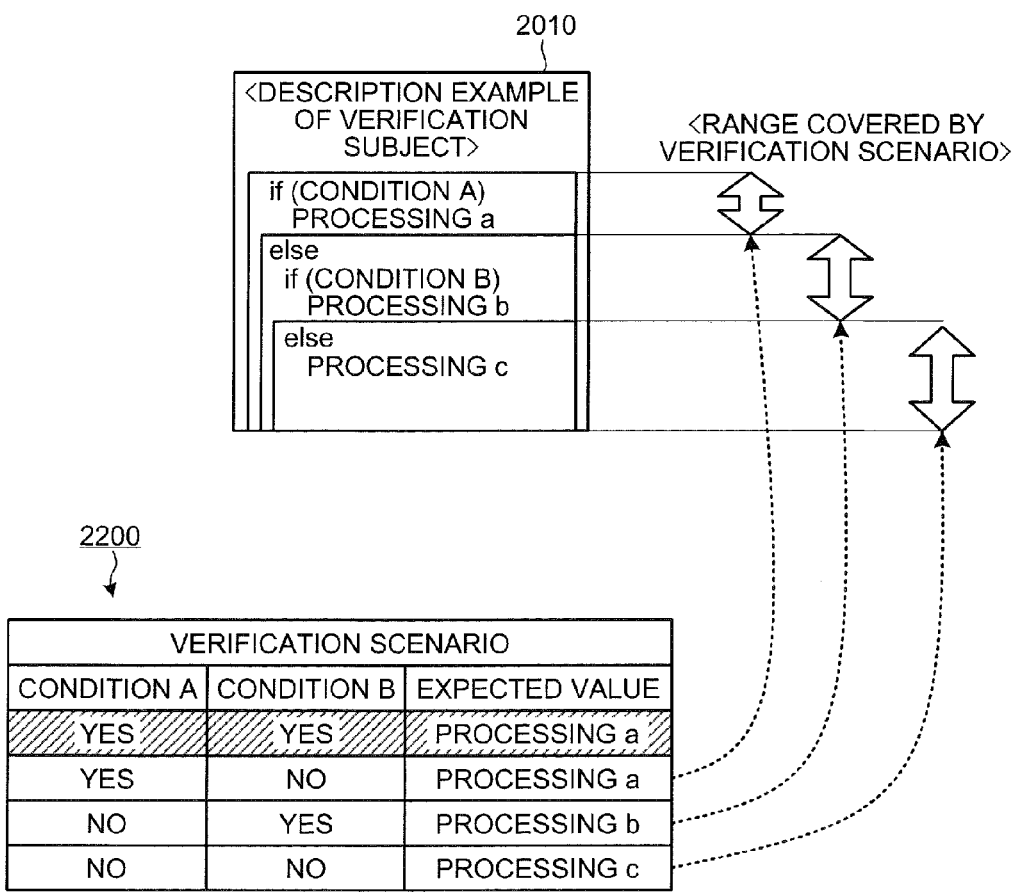
FIG. 22 is a schematic diagram for explaining a verification scenario having 100% line coverage.

A replacement of a case statement with an if statement is explained next. In the assertion creation processing described above, an if statement is retrieved from the description of a combinational circuit to be verified to create a cover statement. However, in an actual situation, description may be by a case statement even when a similar conditional branch is expressed. FIG. 19 is a schematic diagram for explaining replacement of a case statement with an if statement. As depicted in FIG. 19, a case statement is replaced with an if statement, and by inputting a combinational circuit description after replacement to the verification support apparatus 100, a conditional branch can be extracted in a similar manner as an if statement.

As described, according to the present embodiment, assertion information to check whether a conditional branch specified by an inspector is created. Specifically, a combination of conditional branches in hierarchy is extracted from an input combinational circuit description, and a simulation program to satisfy conditions that are specified by the extracted combination is created. Whether verification has been performed can be determined based on whether the conditions are satisfied in this simulation program. As a result, verification of a conditional branch that has been omitted in conventional verification coverage can also be covered, and the verification accuracy for hardware design can be improved.

While the verification support apparatus 100 has such a configuration that the function of creating the assertion information and the function of performing the simulation verification using the created assertion information are both provided, the verification support apparatus 100 may be a device only having the function of creating the assertion information. The assertion information created by the verification support apparatus 100 may be applied for any use by other verification apparatuses.

The verification support method explained in the present embodiment can be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be distributed through a network such as the Internet.

The verification support apparatus 100 described in the present embodiment can be realized by an application specific integrated circuit (ASIC) such as a standard cell or a structured ASIC, or a programmable logic device (PLD) such as a field-programmable gate array (FPGA). Specifically, for example, functional units (the receiving unit 501 to the deleting unit 508) of the verification support apparatus 100 are defined in hardware description language (HDL), which is logically synthesized and applied to the ASIC, the PLD, etc., thereby enabling manufacture of the verification support apparatus 100.

According to the embodiment, in a combination of conditional branches included in hardware description to be verified, assertion information (simulation program) that realizes a specified condition is output. Therefore, if the assertion information is output specifying a condition having a possibility that verification has been omitted, by executing simulation verification using this assertion information, whether verification of the condition is covered can be checked based on a result of the simulation verification.

According to the embodiment, the verification accuracy of a hardware design is improved, thereby preventing omissions in the verification of hardware including more than one conditional branch and facilitating the provision of a hardware design that is bug-free.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A computer-readable recording medium storing therein a verification support program that causes a computer to execute:

receiving a hardware description of a combinational circuit to be verified;

extracting, from the hardware description, a conditional branch description expressing conditional branch processing;

identifying, from among conditional branch descriptions extracted at the extracting of a conditional branch description and based on a description sequence in the hardware description, a combination of conditional branch descriptions having a hierarchical relation;

extracting, from among combinations of conditional branch descriptions identified at the identifying, a combination having a potential to satisfy a specified condition;

generating a simulation program that causes the specified condition for the conditional branch descriptions included in the combination extracted at the extracting of the combination to be satisfied; and outputting, as assertion information of the combinational circuit, the simulation program created for each combination at the creating, wherein the generating includes generating, as the simulation program, a cover statement that causes the specified condition for the conditional branch descriptions included in the combination extracted at the extracting of the combination, to be satisfied simultaneously.

2. The computer-readable recording medium according to claim 1, the verification support program further causing the computer to execute converting the hardware description into a control flow graph expressing a flow of control of the combinational circuit, wherein the identifying includes identifying, from the control flow graph obtained at the converting, a combination of conditional branch descriptions that are connected in parallel as the combination of conditional branch descriptions having a hierarchical relation.

3. The computer-readable recording medium according to claim 1, wherein the receiving includes receiving priority information indicating execution priority of the conditional branch descriptions relative to other conditional branches, and the identifying includes identifying the combination, based on the priority information.

4. The computer-readable recording medium according to claim 1, the verification support program further causing the computer to execute deleting, from among combinations of conditional branch descriptions identified at the identifying, a specific combination of conditional branch descriptions designated in advance, wherein the extracting of the combination includes extracting the combination, after the specific combination has been deleted at the deleting.

5. The computer-readable recording medium according to claim 1, the verification support program further causing the computer to execute verifying the combinational circuit based on whether an output value is equal to an expected value, the output value being obtained when a simulation program correlated with the combination is executed using the assertion information output at the outputting.

6. A verification support apparatus comprising:
a receiving unit that receives a hardware description of a combinational circuit to be verified; a description extracting unit that extracts, from the hardware description, a conditional branch description expressing conditional branch processing;
an identifying unit that, from among conditional branch descriptions extracted by the description extracting unit and based on a description sequence in the hardware description, identifies a combination of conditional branch descriptions having a hierarchical relation;
a combination extracting unit that extracts, from among combinations of conditional branch descriptions identified by the identifying unit, a combination having a potential to satisfy a specified condition;
a generating unit that generates a simulation program that causes the specified condition for the conditional branch descriptions included in the combination extracted by the combination extracting unit to be satisfied; and
an output unit that outputs, as assertion information of the combinational circuit, the simulation program created for each combination by the creating unit;
wherein the generating unit generates, as the simulation program, a cover statement that causes the specified condition for the conditional branch descriptions included in the combination extracted by the combination extracting unit to be satisfied simultaneously.

7. A verification support method executed by a computer comprising:
receiving, by the computer, a hardware description of a combinational circuit to be verified;
extracting, from the hardware description, a conditional branch description expressing conditional branch processing;
identifying, from among conditional branch descriptions extracted at the extracting of a conditional branch description and based on a description sequence in the hardware description, a combination of conditional branch descriptions having a hierarchical relation;
extracting, from among combinations of conditional branch descriptions identified at the identifying, a combination having a potential to satisfy a specified condition;
generating a simulation program that causes the specified condition for the conditional branch descriptions included in the combination extracted at the extracting of the combination to be satisfied;
outputting, as assertion information of the combinational circuit, the simulation program created for each combination at the creating; and
generating, as the simulation program, a cover statement that causes the specified condition for the conditional branch descriptions included in an extracted combination to be satisfied simultaneously.

* * * * *